(12) United States Patent
Hush

(10) Patent No.: US 9,899,064 B2
(45) Date of Patent: *Feb. 20, 2018

(54) APPARATUSES AND METHODS FOR SHIFTING DATA

(71) Applicant: Micron Technology, Inc., Boise, ID (US)

(72) Inventor: Glen E. Hush, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/583,734

(22) Filed: May 1, 2017

(65) Prior Publication Data

US 2017/0337954 A1    Nov. 23, 2017

Related U.S. Application Data

(63) Continuation of application No. 15/158,205, filed on May 18, 2016, now Pat. No. 9,659,610.

(51) Int. Cl.
| | |
|---|---|
| G11C 5/06 | (2006.01) |
| G11C 7/10 | (2006.01) |
| G11C 7/06 | (2006.01) |
| G11C 7/12 | (2006.01) |

(52) U.S. Cl.
CPC ............ *G11C 7/1036* (2013.01); *G11C 5/06* (2013.01); *G11C 7/065* (2013.01); *G11C 7/12* (2013.01)

(58) Field of Classification Search
CPC ........... G11C 7/1036; G11C 7/12; G11C 7/06; G11C 7/065; G11C 7/08; G11C 7/103; G11C 7/1048; G11C 5/06
See application file for complete search history.

(56) References Cited

U.S. PATENT DOCUMENTS

| | | | |
|---|---|---|---|
| 4,380,046 A | 4/1983 | Fung | |
| 4,435,792 A | 3/1984 | Bechtolsheim | |
| 4,435,793 A | 3/1984 | Ochii | |
| 4,727,474 A | 2/1988 | Batcher | |
| 4,843,264 A | 6/1989 | Galbraith | |
| 4,958,378 A | 9/1990 | Bell | |
| 4,977,542 A | 12/1990 | Matsuda et al. | |
| 5,023,838 A | 6/1991 | Herbert | |
| 5,034,636 A | 7/1991 | Reis et al. | |
| 5,201,039 A | 4/1993 | Sakamura | |
| 5,210,850 A | 5/1993 | Kelly et al. | |

(Continued)

FOREIGN PATENT DOCUMENTS

| | | |
|---|---|---|
| CN | 102141905 | 8/2011 |
| EP | 0214718 | 3/1987 |

(Continued)

OTHER PUBLICATIONS

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

(Continued)

*Primary Examiner* — Toan Le
(74) *Attorney, Agent, or Firm* — Brooks, Cameron & Huebsch, PLLC

(57) ABSTRACT

The present disclosure includes apparatuses and methods related to shifting data. A number of embodiments include an apparatus comprising pre-charge lines and n-channel transistors without complementary p-channel transistors. A number of embodiments include a method comprising shifting data by pre-charging nodes with an operating voltage.

20 Claims, 10 Drawing Sheets

(56) References Cited

U.S. PATENT DOCUMENTS

| | | |
|---|---|---|
| 5,253,308 A | 10/1993 | Johnson |
| 5,276,643 A | 1/1994 | Hoffmann et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,692,466 B2 | 4/2010 | Ahmadi |
| 7,685,365 B2 | 5/2010 | Rajwar et al. |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mokhlesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 9,659,610 B1* | 5/2017 | Hush .............. G11C 7/1036 |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |

(56) References Cited

U.S. PATENT DOCUMENTS

| | | |
|---|---|---|
| 2003/0101405 A1* | 5/2003 | Shibata .............. G06F 11/1068 714/763 |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0178053 A1 | 7/2008 | Gorman et al. |
| 2008/0215937 A1 | 9/2008 | Dreibelbis et al. |
| 2008/0165601 A1 | 12/2008 | Matick et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134226 A1 | 5/2012 | Chow |
| 2012/0135225 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0279466 A1 | 3/2015 | Manning |
| 2015/0120987 A1 | 4/2015 | Wheeler |
| 2015/0134713 A1 | 5/2015 | Wheeler |
| 2015/0270015 A1 | 9/2015 | Murphy et al. |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |
| 2015/0357047 A1 | 12/2015 | Tiwari |
| 2016/0062672 A1 | 3/2016 | Wheeler |
| 2016/0062673 A1 | 3/2016 | Tiwari |
| 2016/0062692 A1 | 3/2016 | Finkbeiner et al. |
| 2016/0062733 A1 | 3/2016 | Tiwari |
| 2016/0063284 A1 | 3/2016 | Tiwari |
| 2016/0064045 A1 | 3/2016 | La Fratta |
| 2016/0064047 A1 | 3/2016 | Tiwari |
| 2016/0098208 A1 | 4/2016 | Willcock |
| 2016/0098209 A1 | 4/2016 | Leidel et al. |
| 2016/0110135 A1 | 4/2016 | Wheeler et al. |
| 2016/0125919 A1 | 5/2016 | Hush |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-in-Memory Chip," Jun. 22-26, 2002, (12 pgs.), ICS '02, retrieved from: http://www.isi.edu/~draper/papers/ics02.pdf.

Adibi, et al., "Proccesing-in-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

(56) References Cited

OTHER PUBLICATIONS

U.S. Appl. No. 13/449,082, entitled, "Methods and Apparatus for Pattern Matching," filed Apr. 17, 2012, (37 pgs.).
U.S. Appl. No. 13/743,686, entitled, "Weighted Search and Compare in a Memory Device," filed Jan. 17, 2013, (25 pgs.).
U.S. Appl. No. 13/774,636, entitled, "Memory as a Programmable Logic Device," filed Feb. 22, 2013, (30 pgs.).
U.S. Appl. No. 13/774,553, entitled, "Neural Network in a Memory Device," filed Feb. 22, 2013, (63 pgs.).
U.S. Appl. No. 13/796,189, entitled, "Performing Complex Arithmetic Functions in a Memory Device," filed Mar. 12, 2013, (23 pgs.).
International Search Report and Written Opinion for PCT Application No. PCT/US2013/043702, dated Sep. 26, 2013, (11 pgs.).
Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.
Pagiamtzis, Kostas, "Content-Addressable Memory Introduction", Jun. 25, 2007, (6 pgs.), retrieved from: http://www.pagiamtzis.com/cam/camintro.

Debnath, Biplob, Bloomflash: Bloom Filter on Flash-Based Storage, 2011 31st Annual Conference on Distributed Computing Systems, Jun. 20-24, 2011, 10 pgs.
Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.
"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.
Stojmenovic, "Multiplicative Circulant Networks Topological Properties and Communication Algorithms", (25 pgs.), Discrete Applied Mathematics 77 (1997) 281-305.
Boyd et al., "On the General Applicability of Instruction-Set Randomization", Jul.-Sep. 2010, (14 pgs.), vol. 7, Issue 3, IEEE Transactions on Dependable and Secure Computing.
Elliot, et al., "Computational RAM: Implementing Processors in Memory", Jan.-Mar. 1999, (10 pgs.), vol. 16, Issue 1, IEEE Design and Test of Computers Magazine.

* cited by examiner

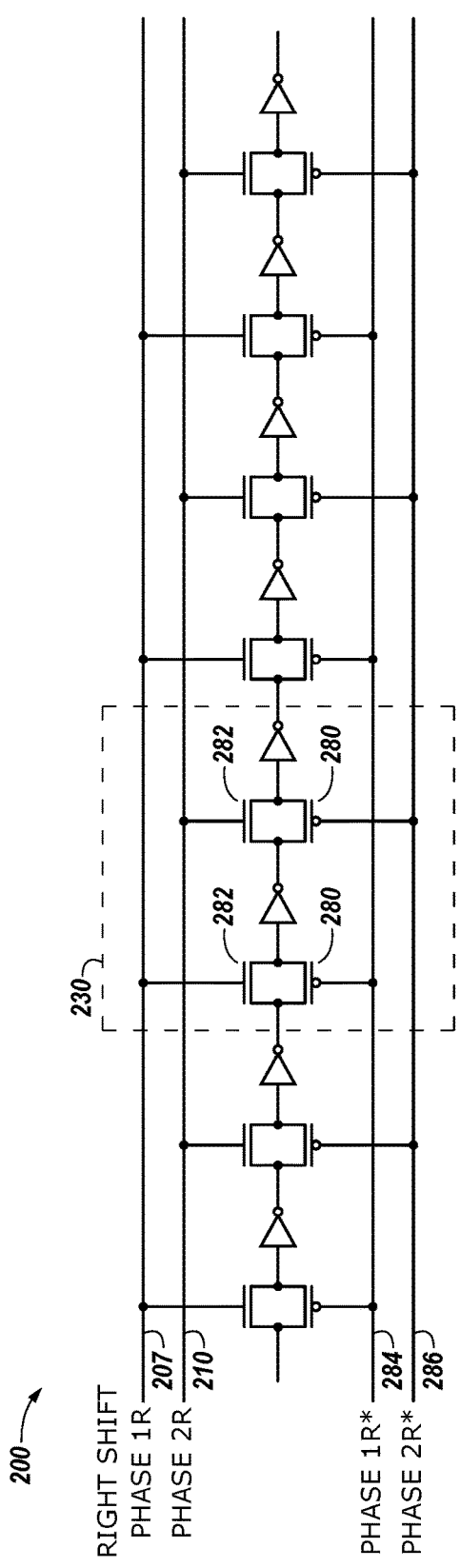
Fig. 2A *(PRIOR ART)*
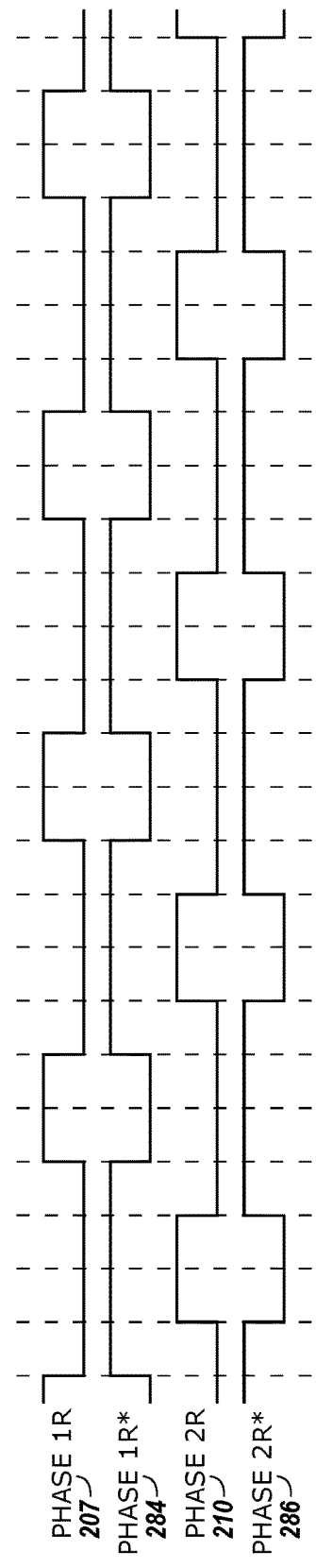
Fig. 2B *(PRIOR ART)*

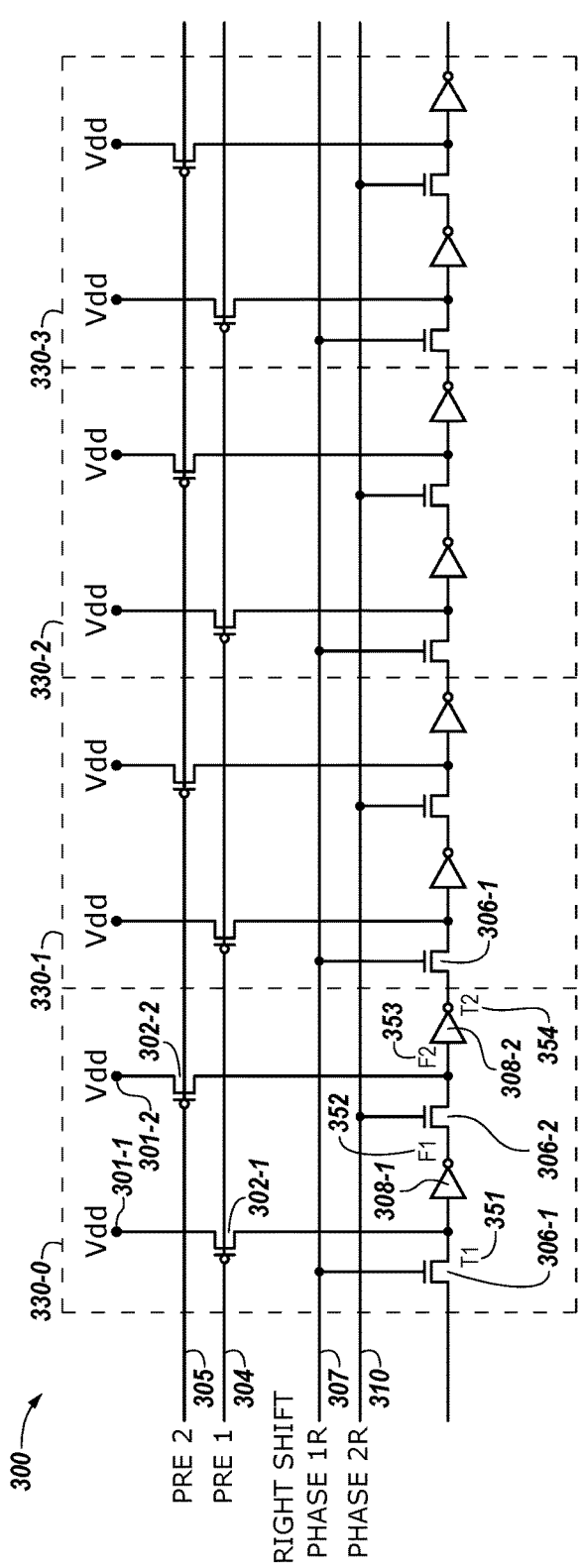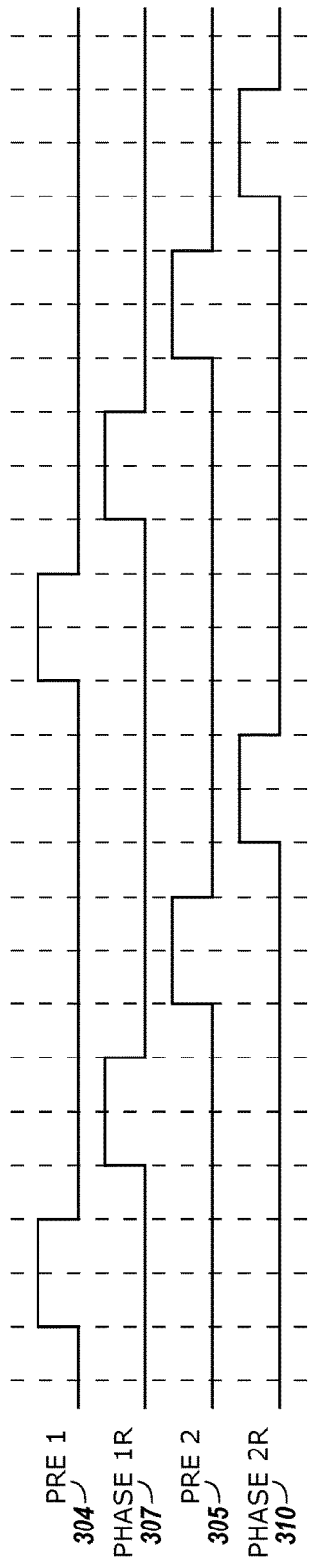
*Fig. 3A*
*Fig. 3B*

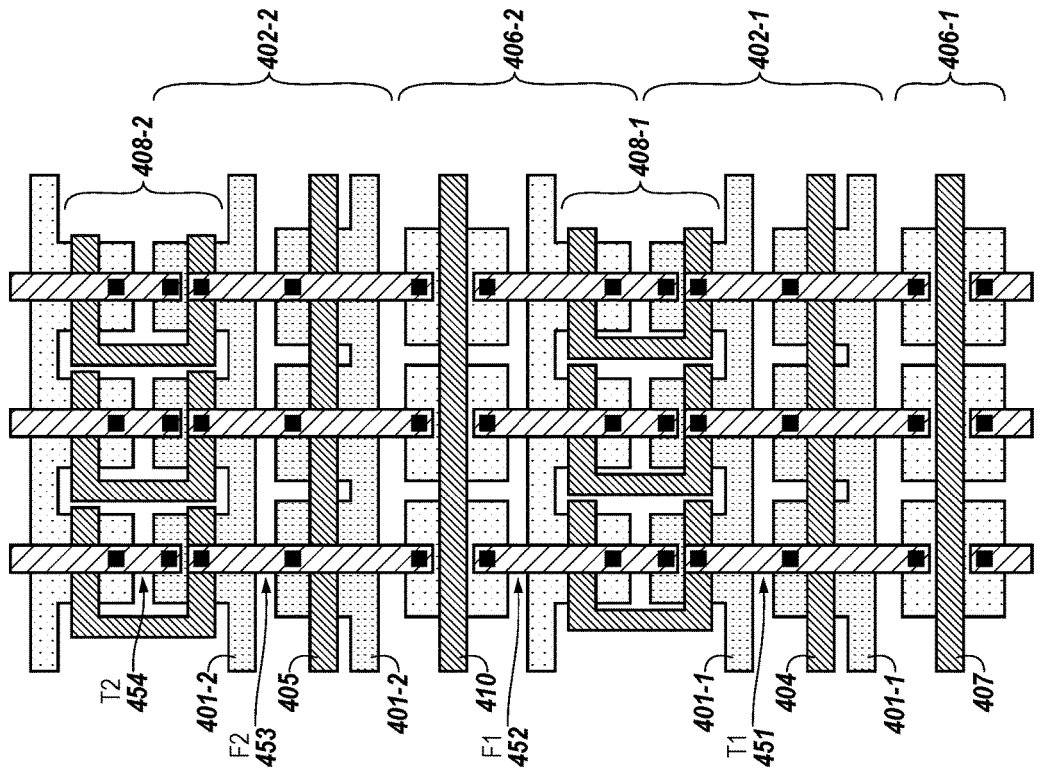
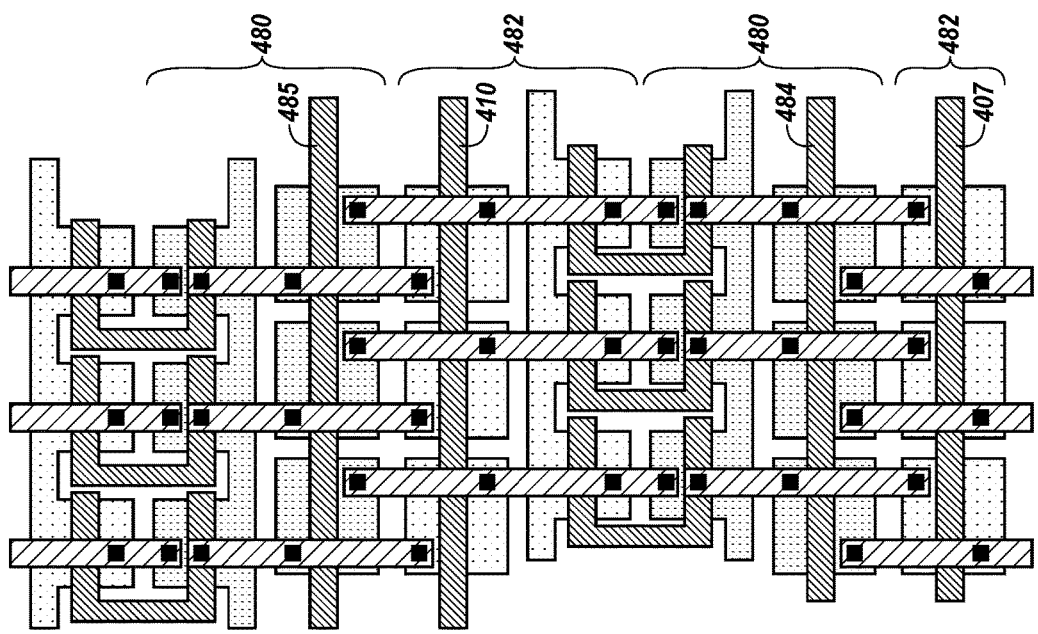
Fig. 4B
Fig. 4A

TABLE 7-1

| | | 720 | 721 | 722 | 723 | 724 |
|---|---|---|---|---|---|---|
| | A | B | NOT OPEN | OPEN TRUE | OPEN INVERT |
| | 0 | 0 | 0 | 0 | 1 |
| | 0 | 1 | 0 | 1 | 0 |

725

| | 1 | 0 | 1 | 0 | 1 |
|---|---|---|---|---|---|
| | 1 | 1 | 1 | 1 | 0 |

TABLE 7-2

| | | A | A*B | A*B̄ | A+B | B | AXB | A+B̄ | ĀXB | B̄ | |
|---|---|---|---|---|---|---|---|---|---|---|---|
| FF | | 0 | 0 | 0 | 0 | 0 | 0 | 1 | 1 | 1 | ← 727-1 |
| FT | | 0 | 0 | 0 | 1 | 1 | 1 | 0 | 0 | 0 | ← 727-2 |
| TF | | 0 | 0 | 1 | 0 | 0 | 1 | 0 | 0 | 1 | ← 727-3 |
| TT | | 0 | 1 | 0 | 0 | 1 | 0 | 0 | 1 | 0 | ← 727-4 |
| A | B | A | A*B | A*B̄ | A+B | B | AXB | A+B̄ | ĀXB | B̄ | ← 728 |
| 0 | 0 | 0 | 0 | 0 | 0 | 0 | 0 | 1 | 1 | 1 | |
| 0 | 1 | 0 | 0 | 0 | 1 | 1 | 1 | 0 | 0 | 0 | |
| 1 | 0 | 1 | 0 | 1 | 1 | 0 | 1 | 1 | 0 | 1 | |
| 1 | 1 | 1 | 1 | 0 | 1 | 1 | 0 | 1 | 1 | 0 | |

727-1, 727-2, 727-3, 727-4 grouped as 726

APPARATUSES AND METHODS FOR SHIFTING DATA

PRIORITY INFORMATION

This application is a Continuation of U.S. application Ser. No. 15/158,205, filed May 18, 2016, the contents of which are included herein by reference.

TECHNICAL FIELD

The present disclosure relates generally to semiconductor memory and methods, and more particularly, to apparatuses and methods related to shifting data.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry may be used to perform arithmetic operations such as addition, subtraction, multiplication, and division on operands via a number of logical operations.

A number of components in an electronic system may be involved in providing instructions to the functional unit circuitry for execution. The instructions may be executed, for instance, by a processing resource such as a controller and/or host processor. Data (e.g., the operands on which the instructions will be executed) may be stored in a memory array that is accessible by the functional unit circuitry. The instructions and data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the instructions and data may also be sequenced and/or buffered.

In many instances, the processing resources (e.g., processor and/or associated functional unit circuitry) may be external to the memory array, and data is accessed via a bus between the processing resources and the memory array to execute a set of instructions. Processing performance may be improved in a processor-in-memory (PIM) device, in which a processor may be implemented internal and/or near to a memory (e.g., directly on a same chip as the memory array), which may reduce time in processing and may also conserve power. Data movement between and within arrays and/or subarrays of various memory devices, such as processing-in-memory devices, can affect processing time and/or power consumption.

BRIEF DESCRIPTION OF THE DRAWINGS

FIG. 2A is a schematic diagram of a previous approach to shifting data.

FIG. 2B is a timing diagram associated with FIG. 2A.

FIG. 3A is a schematic diagram of a shift register configured to perform a right shift in accordance with a number of embodiments of the present disclosure.

FIG. 3B is a timing diagram associated with FIG. 3A in accordance with a number of embodiments of the present disclosure.

FIGS. 4A and 4B are a comparison of a planform view of a portion of a shift register in accordance with a previous approach to a planform view of a portion of a shift register in accordance with a number of embodiments of the present disclosure.

DETAILED DESCRIPTION

Figure 1:
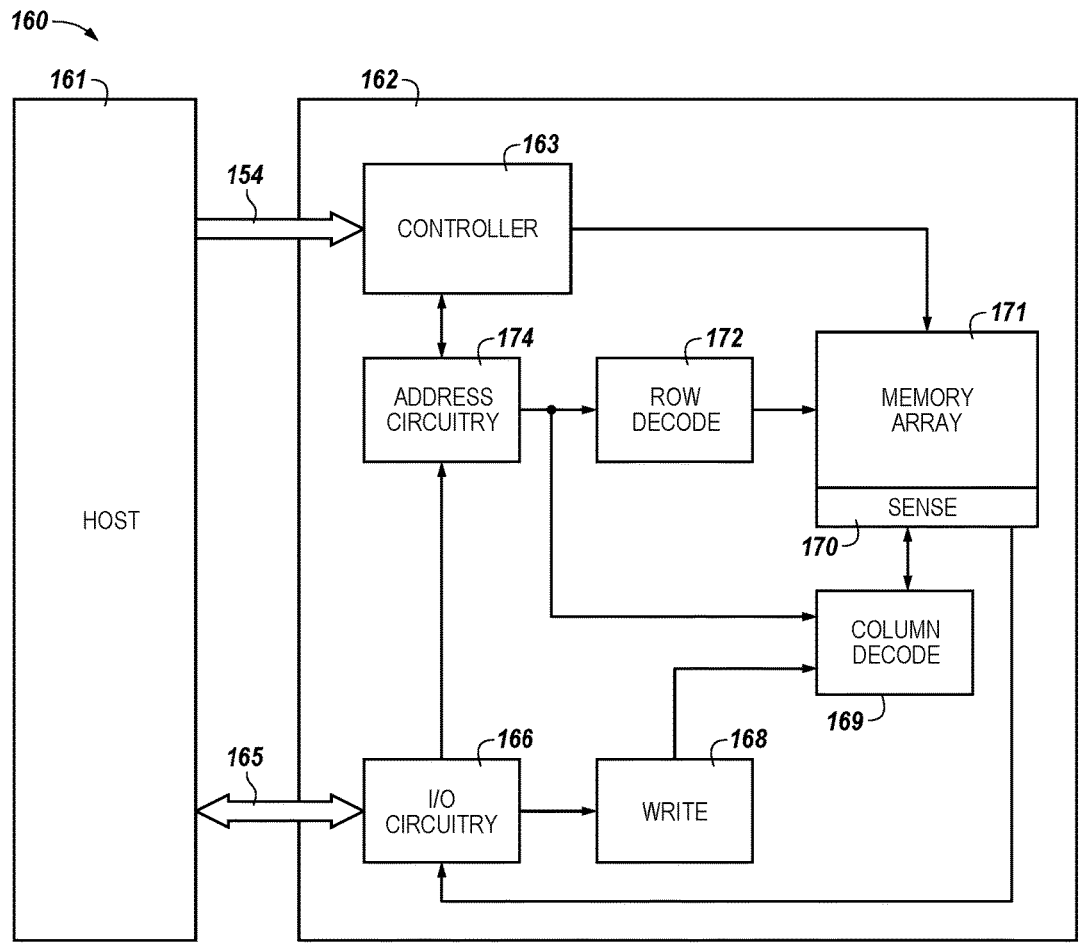
FIG. 1 is a block diagram of an apparatus in the form of a computing system including a memory device in accordance with a number of embodiments of the present disclosure.

A number of embodiments include an apparatus for shifting data that has a small enough die size so that the apparatus can be on pitch with other components (e.g., sense lines, memory cells, and compute components).

In some previous approaches to shifting data, each n-channel transistor in a shift register may require a complementary p-channel transistor. As the number of n-channel transistors required for shift operations increases, the die size of the shift register also increases. As a result, previous approaches to shifting data may not be on pitch with sense lines and other components coupled to the sense lines.

Embodiments disclosed herein can include mechanisms on a memory device for shifting data. For example, embodiments include mechanisms on a memory device that can shift data without the use of complementary p-channel transistors. In some embodiments, such mechanisms can include one or more pre-charge lines. Additionally, embodiments can shift data to the right and/or to the left by a number of units. In some embodiments, can be a "long" shift register such as a shift register with around 16,000 or more data cells. Although specific reference is made to shifting data in a shift register, embodiments are not so limited, and, as will be appreciated, can include shifting data within sensing circuitry (e.g., an accumulator), subarrays, banks, etc. within a memory device.

A number of embodiments of the present disclosure can provide improved parallelism, increased speed, and/or reduced power consumption in association with performing data movement operations as compared to some previous approaches such as previous PIM devices and systems having an external processor (e.g., a processing resource located external from a memory array, such as on a separate integrated circuit chip). For example, a number of embodiments can provide for moving data on a shift register while performing compute functions such as integer add, subtract, multiply, divide, and CAM (content addressable memory) functions without transferring data out of the memory array and sensing circuitry via a bus (e.g., data bus, address bus, control bus), for instance. Such compute functions can involve performing a number of logical operations (e.g., logical functions such as AND, OR, NOT, NOR, NAND, XOR, etc.). However, embodiments are not limited to these examples. For instance, performing logical operations can include performing a number of non-Boolean logic operations such as copy, compare, destroy, etc.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, "a number of" a particular thing can refer to one or more of such things (e.g., a number of memory arrays can refer to one or more memory arrays). A "plurality of" is intended to refer to more than one of such things.

The figures herein follow a numbering convention in which the first digit or digits correspond to the drawing figure number and the remaining digits identify an element or component in the drawing. Similar elements or components between different figures may be identified by the use of similar digits. For example, 302 may reference element "02" in FIG. 3, and a similar element may be referenced as 502 in FIG. 5. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 160 including a memory device 162 in accordance with a number of embodiments of the present disclosure. As used herein, a memory device 162, controller 163, memory array 171, and/or sensing circuitry 170 can also be separately considered an "apparatus."

The computing system 160 can include a host 161 coupled (e.g., directly or indirectly connected) to the memory device 162, which can include a memory array 171. The host 161 can be a host system such as a personal laptop computer, a desktop computer, a digital camera, a smart phone, or a memory card reader, among various other types of hosts. The host 161 can include a system motherboard and/or backplane and can include a number of processing resources (e.g., one or more processors, microprocessors, or some other type of controlling circuitry). The system 160 can include separate integrated circuits or both the host 161 and the memory device 162 can be on the same integrated circuit. The system 160 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures (e.g., a Turing machine), which may not include one or more components (e.g., CPU, ALU, etc.) often associated with a Von Neumann architecture.

For clarity, the system 160 has been simplified to focus on features with particular relevance to the present disclosure. The memory array 171 can be a hybrid memory cube (HMC), computational memory such as a processing in memory random access memory (PIMRAM) array, which can include one or more of a DRAM array, SRAM array, STT RAM array, PCRAM array, TRAM array, RRAM array, NAND flash array, and/or NOR flash array, for instance. The memory array 130 can comprise memory cells arranged in rows coupled by access lines, which may be referred to herein as word lines or select lines, and columns coupled by sense lines, which may be referred to herein as data lines or digit lines. Although a single memory array 171 is shown in FIG. 1, embodiments are not so limited. For instance, memory device 120 may include a number of memory arrays 171 (e.g., a number of banks of DRAM cells, NAND flash cells, etc.).

The memory device 162 can include address circuitry 169 to latch address signals provided over an input/output "I/O" bus 165 (e.g., data bus and/or address bus) through I/O circuitry 166 (e.g., provided to external ALU circuitry and to DRAM DQs via local I/O lines and global I/O lines). Address signals can be received and decoded by a row decoder 172 and a column decoder 169 to access the memory array 171. Data can be read from the memory array 171 by sensing voltage and/or current changes on the sense lines using sensing circuitry 170. The sensing circuitry 170 can read and latch a page (e.g., row) of data from the memory array 171. The I/O circuitry 163 can be used for bi-directional data communication with the host 161 over the I/O bus 165. The write circuitry 168 can be used to write data to the memory device 162. The controller 163 decodes signals provided by a control bus 164 from the host 161. These signals can include chip enable signals, write enable signals, and address latch signals that are used to control operations performed on the memory array 171, including data read, data write, and data erase operations. In various embodiments, the controller 163 is responsible for executing instructions from the host 161 and sequencing access to the memory array 171. The controller 163 can be a state machine (e.g., hardware and/or firmware in the form of an application specific integrated circuit (ASIC)), a sequencer, or some other type of controller. The controller 163 can control, for example generation of clock signals by controlling a location and/or time at which clock signals are initiated. For example, as described in more detail herein, the controller 163 can be in communication with a shift register, which may comprise a number of sense amplifiers and/or compute components to provide clock signals to shift data. In some examples, the controller 163 can control shifting data in a number of banks, subarrays, and/or shift registers by activating signal control lines (e.g., "PHASE 1R" 307 and "PHASE 2R" 310 illustrated in FIG. 3) or pre-charge lines (e.g., "PRE 1" 304 and "PRE 2" 305 illustrated in FIG. 3).

Example sensing circuitry 170 is described further below. For instance, in a number of embodiments, the sensing circuitry 170 can comprise a number of sense amplifiers and a number of compute components, which may serve as, and be referred to herein as an accumulator, and can be used to perform logical operations (e.g., on data associated with complementary sense lines). In at least one embodiment, storage locations (e.g., latches) corresponding to the compute components can comprise at least a portion of a shift register.

In a number of embodiments, the sensing circuitry 170 can be used to perform logical operations using data stored in the memory array 171 as inputs and store the results of the logical operations back to the memory array 171 without transferring data via a sense line address access (e.g., without firing a column decode signal). As such, various compute functions can be performed using, and within, the sensing circuitry 170 rather than (or in association with) being performed by processing resources external to the sensing circuitry (e.g., by a processor associated with the host 161 and/or other processing circuitry, such as ALU circuitry, located on the memory device 162 (e.g., on controller 163 or elsewhere)).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O lines. In contrast, in a number of embodiments of the present disclosure, the sensing circuitry 170 is configured to perform logical operations on data stored in the memory array 171 and store the result back to the memory array 171 without enabling an I/O line (e.g., a local I/O line) coupled to the sensing circuitry 170. The sensing circuitry 170 can be formed on pitch with the memory cells of the array.

As such, in a number of embodiments, circuitry external to the array 171 and the sensing circuitry 170 is not needed to perform compute functions as the sensing circuitry 170 can perform the appropriate logical operations to perform such compute functions without the use of an external processing resource. Therefore, the sensing circuitry 170 may be used to complement and/or to replace, at least to some extent, such an external processing resource (or at least the bandwidth consumption of such an external processing resource).

However, in a number of embodiments, the sensing circuitry 170 may be used to perform logical operations (e.g., to execute instructions) in addition to logical operations performed by an external processing resource (e.g., the host 161). For instance, the host 161 and/or the sensing circuitry 170 may be limited to performing only certain logical operations and/or a certain number of logical operations.

Enabling an I/O line can include enabling (e.g., turning on) a transistor having a gate coupled to a decode signal (e.g., a column decode signal) and a source/drain coupled to the I/O line. However, embodiments are not limited to enabling an I/O line. For instance, in a number of embodiments, the sensing circuitry (e.g., 170) can be used to perform logical operations without enabling column decode lines of the array; however, the local I/O line(s) may be enabled in order to transfer a result to a suitable location other than back to the memory array 171 (e.g., to an external register).

FIG. 2A is a schematic diagram of a previous approach to shifting data. As shown in FIG. 2, in many instances, a shift register 200 may require a complementary p-channel transistor 280 for each and every n-channel transistor 282. Thus, as more n-channel transistors 282 are needed for additional shift operations, including a left shift, a right shift by two, and a left shift by two, more complementary p-channel transistors 280 must also be added. Consequently, the size and layout of a shift register 200 may be constrained and compute components may not be on pitch with other components (e.g., sense lines and/or sense amplifiers).

Furthermore, the circuitry of the processing resource(s) (e.g., a compute engine such as an ALU) may not conform to pitch rules associated with a memory array. For example, the cells of a memory array may have a $4F^2$ or $6F^2$ cell size, where "F" is a feature size corresponding to the cells. As such, the devices (e.g., logic gates) associated with ALU circuitry of previous PIM systems may not be capable of being formed on pitch with the memory cells, which can affect chip size and memory density, for example.

In contrast, in a number of embodiments of the present disclosure, the sensing circuitry (e.g., 170) can be formed on a same pitch as a pair of complementary sense lines. As an example, memory cells coupled to pairs of complementary sense lines may have a cell size of $6F^2$ (e.g., 3F×2F), with the complementary sense lines having a 3F pitch. In this example, the sensing circuitry being on pitch with the complementary sense line pairs and/or on pitch with the memory cells indicates the sensing circuitry (e.g., a sense amplifier and corresponding compute component per respective pair of complementary sense lines) is formed to fit within the 3F pitch of the complementary sense lines.

Referring back to FIG. 2, the n-channel transistors 282 may be enabled when a signal is applied to the signal control lines "PHASE 1R" 207 and "PHASE 2R" 210 as shown in FIG. 2B. Similarly, the p-channel transistors 280 may be enabled when a signal is applied to the signal control lines "PHASE 1R*" 284 and "PHASE 2R*" 286 as shown in FIG. 2B. The shift register 200 may be comprised of a plurality of compute components 230, which is denoted by a dotted box. As more n-channel transistors 282 and complementary p-channel transistors 280 are added, the compute components 230 get larger and more difficult to keep on pitch. Additionally, as the shift register 200 becomes longer and the number of compute components 230 increases the amount of power required to operate the shift register 200 may increase as a result of a voltage drop, or leakage, across an n-channel transistor 282. For example, if an n-channel transistor 282 has a threshold voltage of 0.6 V and a 1 V supply is used, then only 0.4 V of the 1 V supplied will pass through the n-channel transistor 282. Thus, a longer shift register 200 may require a higher voltage supply to compensate for the voltage drop, or leakage, across each n-channel transistor 282 of the shift register 200.

FIG. 2B is a timing diagram associated with FIG. 2A. FIG. 2B shows signaling that can be applied to signal control lines "PHASE 1R" 207, "PHASE 1R*" 284, "PHASE 2R" 210, and "PHASE 2R*" 286. The signal control lines "PHASE 1R" 207, "PHASE 1R*" 284, "PHASE 2R" 210, and "PHASE 2R*" 286 may be two non-overlapping two-phase clocks.

FIG. 3A is a schematic diagram of a shift register configured to perform a right shift in accordance with a number of embodiments of the present disclosure. In the example shown in FIG. 3, the shift register 300 is configured to perform a right shift. The shift register 300 can contain a plurality of compute components, such as the compute components 330-0, 330-1, 330-2, and 330-3. The pre-charge lines "PRE 1" 304 and "PRE 2" 305 can be used to enable the p-channel transistors 302-1 and 302-2, respectively, as shown in FIG. 3B. By pre-charging the nodes "T1" 351 and "F2" 353, the n-channel transistors 306-1 and 306-2 can only have to pass a "low" voltage. Similarly, the signal control lines "PHASE 1R" 307 and "PHASE 2R" 310 can be used to enable the n-channel transistors 306-1 and 306-2, respectively, as shown in FIG. 3B. The pre-charge lines "PRE 1" 304 and "PRE 2" 305 can allow the n-channel transistors 306-1 and 306-2 to only have to pass a low voltage. The low voltage can be a low voltage relative to an operating voltage. The operating voltage can be supplied by a rail voltage line (e.g., Vdd). If a high voltage is to be passed by the n-channel transistors 306-1 and 306-2, then the node that is to receive the high voltage can already have the high voltage as a function of pre-charging the node with the operating voltage.

As illustrated in FIG. 3, a first p-channel transistor 302-1 can include a terminal coupled to a first voltage supply node 301-1, which can be coupled to a rail voltage line (e.g., Vdd), a gate coupled to a first pre-charge line "PRE 1" 304, and another terminal coupled to a node "T1" 351. A second p-channel transistor 302-2, can include a terminal coupled to a second voltage supply node 301-2, which can be coupled to a rail voltage line (e.g., Vdd), a gate coupled to a second pre-charge line "PRE 2" 305, and another terminal coupled to a node "F2" 353. A first n-channel transistor 306-1 can include a terminal coupled to the node "T1" 351 and a gate coupled to a signal control line "PHASE 1R" 307. A first inverter 308-1 can include an input coupled to the node "T1" 351 and an output coupled to the node "F1" 352. A second n-channel transistor 306-2 can include terminals coupled to the node "F1" 352 and the node "F2" 353, respectively, and a gate coupled to a signal control line "PHASE 2R" 310. A second inverter 308-2 has an input coupled to the node "F2" 353.

The aforementioned components can comprise a first compute component 330-0, as denoted by the dotted line box. The shift register 300 can be comprised of a plurality of the compute components 330 such that the compute component 330-0 is a first compute component 330-0, the compute component 330-1 is a second compute component 330-1, and the compute component 330-2 is a third compute component 330-2. A node "T2" 354 of the first compute component 330-0 is coupled to a terminal of the first n-channel transistor 306-1 of the second compute component 330-1. A pair of complementary sense lines can be coupled to the nodes "T1" 351 and "F2" 353 (not shown in FIG. 3, refer to FIG. 6 for an example). Each sense line of the pair of complementary sense lines can be coupled to a memory cell.

FIG. 3B is a timing diagram associated with FIG. 3A in accordance with a number of embodiments of the present disclosure. FIG. 3B shows signaling that can be applied to pre-charge lines "PRE 1" 304 and "PRE 2" 305, and signal control lines "PHASE 1R" 307, and "PHASE 2R" 310. The signal control lines "PHASE 1R" 307 and "PHASE 2R" 310, and the pre-charge lines "PRE 1" 304 and "PRE 2" 305 can be two non-overlapping two-phase clocks. As discussed above, benefits of embodiments of the present disclosure may include a lack of complementary p-channel transistors, which can correspond to a smaller die size and a lack of a second power supply. However, applying signals to the pre-charge lines during a shift operation can increase the amount of time required to complete the shift operation as compared to previous approaches. The difference in the amount of time required to complete the shift operation can be seen by comparing the signaling for the shift register 200 illustrated in FIG. 2 to the signaling for the shift register 300 illustrated in FIG. 3. The signaling shown in the timing diagram in FIG. 7 for "PRE 1," "PRE 2," "PHASE 1R," and "PHASE 2R" illustrates an example shift operation, two right shifts, performed with the shift register 300 illustrated in FIG. 3A.

FIGS. 4A and 4B illustrate a comparison of a planform view of a portion of a shift register in accordance with a previous approach to a planform view of a portion of a shift register in accordance with a number of embodiments of the present disclosure. FIG. 4A shows a shift register that is in accordance with a previous approach and analogous to the shift register 200 illustrated in FIG. 2. FIG. 4A illustrates the signal control lines "PHASE 1R" 407, "PHASE 1R*" 484, "PHASE 2R" 410, and "PHASE 2R*" 486. FIG. 4A also illustrates the n-channel transistors 482 and the complementary p-channel transistors 480. FIG. 4B shows a shift register that is in accordance with a number of embodiment of the present disclosure and analogous to the shift register 300 illustrated in FIG. 3. FIG. 4B illustrates the signal control lines "PHASE 1R" 407 and "PHASE 2R" 410, the pre-charge lines "PRE 1" 404 and "PRE 2" 405, and the first and a second voltage supply nodes 401-1 and 401-2. FIG. 4A also illustrates the first and second n-channel transistors 406-1 and 406-2, the first and second p-channel transistors 402-1 and 402-2, the first and second inverters 408-1 and 408-2, and the nodes "T1" 451, "F1" 452, "F2" 453, and "T2" 454. As shown by the comparison of FIG. 4A to FIG. 4B, embodiments in accordance with the present disclosure can be arranged on pitch with sense lines and other components coupled to sense lines.

Figure 5:
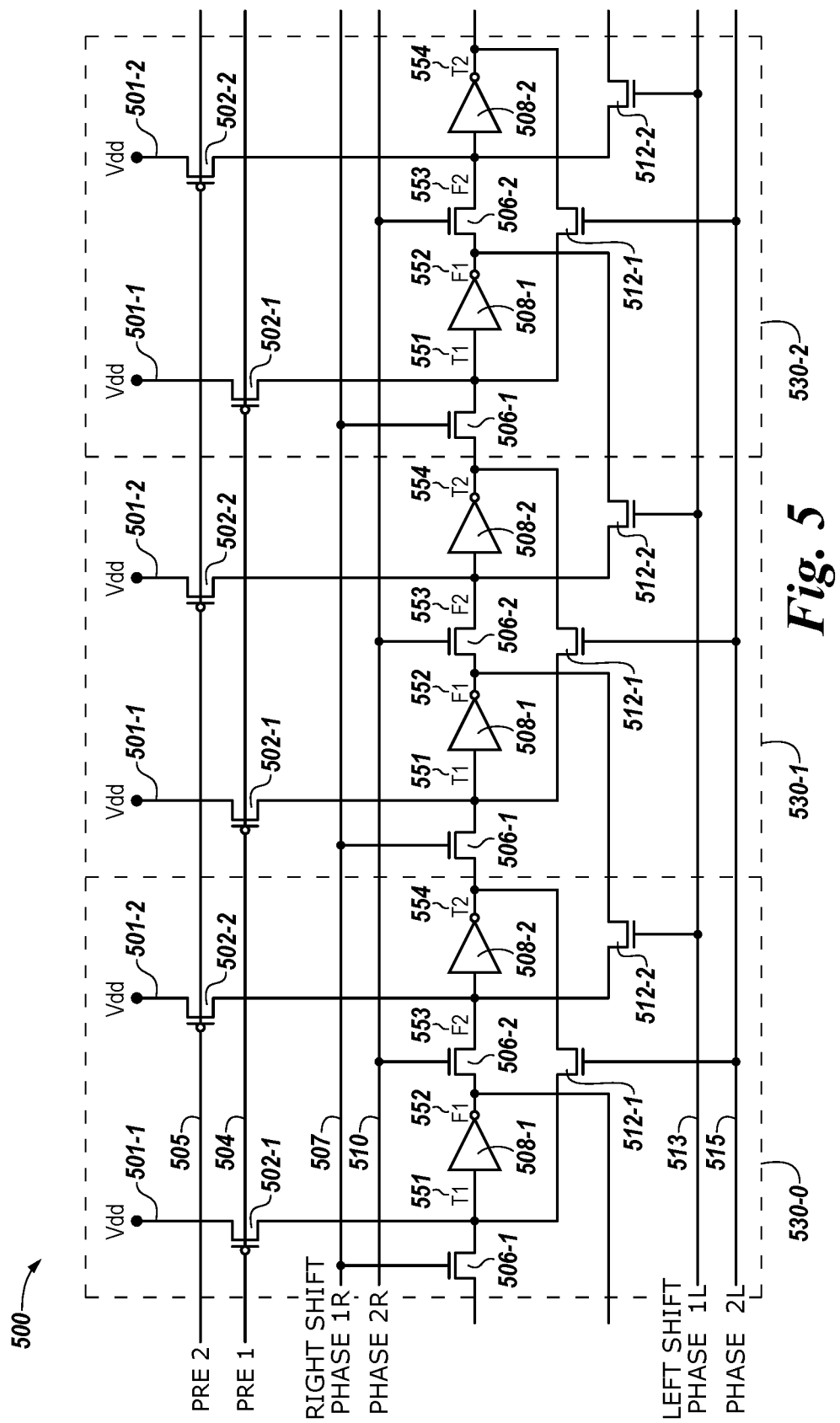
FIG. 5 is a schematic diagram of a shift register configured to perform a right shift and/or a left shift in accordance with a number of embodiments of the present disclosure.

FIG. 5 is a schematic diagram of a shift register configured to perform a right shift and/or a left shift in accordance with a number of embodiments of the present disclosure. The shift register 500 can be comprised of a plurality of compute components, such as a first compute component 530-0, a second compute component 530-1, and a third compute component 530-2. The compute components 530 can contain some of the same components as the compute components 330 illustrated in FIG. 3A. The pre-charge lines "PRE 1" 504 and "PRE 2" 505 can have the same functionality as described with respect to FIGS. 3A and 3B above.

The first shift component 530-0 includes a first p-channel transistor 502-1 can include a terminal coupled to a first voltage supply node 501-1, which can be coupled to a rail voltage line (e.g., Vdd), a gate coupled to a first pre-charge line "PRE 1" 504, and another terminal coupled to a node "T1" 551. A second p-channel transistor 502-2 can include a terminal coupled to a second voltage supply node 501-2, which can be coupled to a rail voltage line (e.g., Vdd), a gate coupled to a second pre-charge line "PRE 2" 505, and another terminal coupled to a node "F2" 553. A first n-channel transistor 506-1 can include a terminal coupled to the node "T1" 551 and a gate coupled to a signal control line "PHASE 1R" 507. A first inverter 508-1 can include an input coupled to the node "T1" 551 and an output coupled to a node "F1" 552. A second n-channel transistor 506-2 can include terminals coupled to the node "F1" 552 and the node "F2" 553, respectively, and a gate coupled to a signal control line "PHASE 2R" 510. A second inverter 508-2 can include an input coupled to the node "F2" 553 and an output coupled to a node "T2" 554.

A third n-channel transistor 512-1 can include terminals coupled to the node "T1" 551 and the node "T2" 554, respectively, and a gate coupled to a signal control line "PHASE 1L" 513. A fourth n-channel transistor 512-2 can include a terminal coupled to the node "F2" 553 and a gate coupled to a signal control line "PHASE 2L" 515. The aforementioned components can comprise the first compute component 530-0, as denoted by the box. The shift register 500 can be comprised of a plurality of the compute components 530 such that the node "T2" 554 of the first compute component 530-0 is coupled to a terminal of the first n-channel transistor 506-1 of the second compute component 530-1. A terminal of the fourth n-channel transistor 512-2 of the second compute component 530-1 can be coupled to the node "F1" 552 of the third compute component 530-2. A pair of complementary sense lines can be coupled to the nodes "T1" 551 and "F2" 553 (not shown in FIG. 5, refer to FIG. 6 for an example). Each sense line of the pair of complementary sense lines can be coupled to a memory cell. The signal control lines "PHASE 1R" 507, "PHASE 2R" 510, "PHASE 1L" 513, and "PHASE 2L" 515, and the pre-charge lines "PRE 1" 504 and "PRE 2" 505 can be three non-overlapping two-phase clocks.

Figure 8:
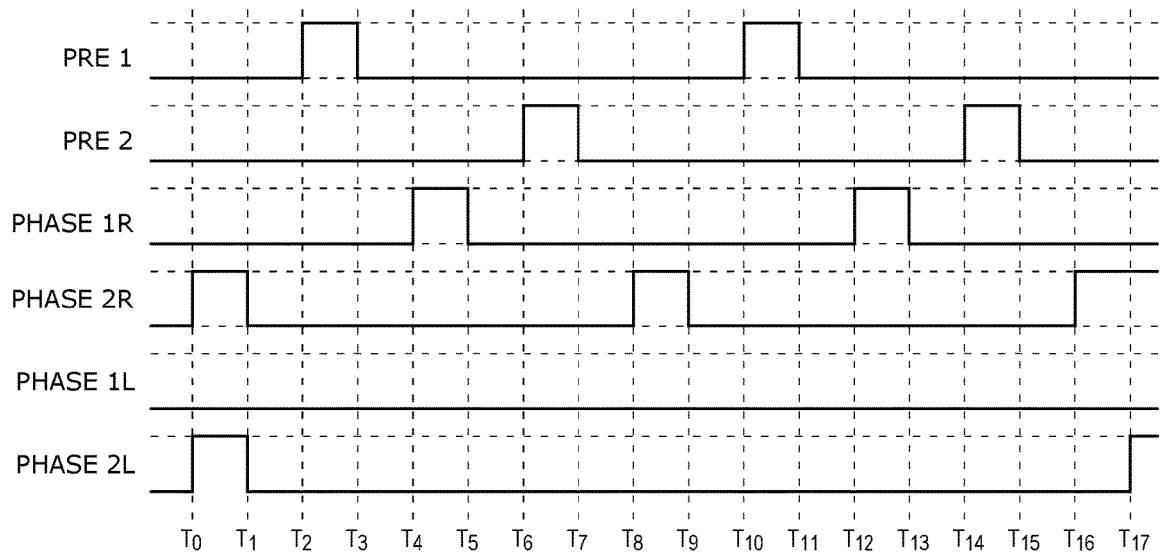
FIG. 8 is a timing diagram associated with two right shifts of data in accordance with a number of embodiments of the present disclosure.

Although FIG. 5 shows an example where a right shift and a left shift can be performed, embodiments of the present disclosure are not so limited. The shift register 500 illustrated in FIG. 5 can be configured for a left shift only by excluding the first and second n-channel transistors 506-1 and 506-2 and the signal control lines "PHASE 1R" 507 and "PHASE 2R" 510. The timing diagram illustrated in FIG. 8 shows signaling for "PRE 1," "PRE 2," "PHASE 1R," "PHASE 2R," "PHASE 1L," and "PHASE 2L" to perform an example shift operation, two left shifts, with the shift register 500 illustrated in FIG. 5.

Figure 6:
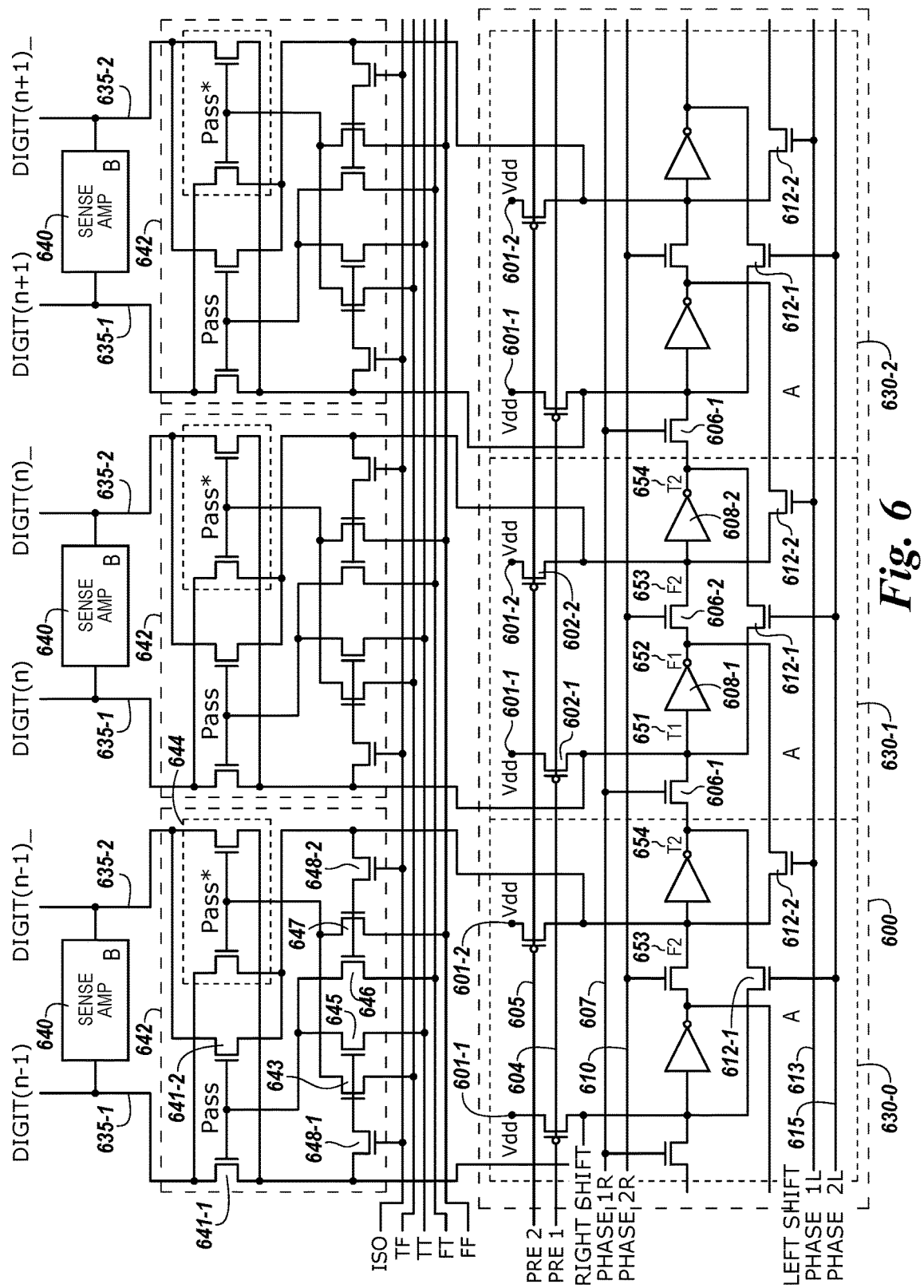
FIG. 6 is a schematic diagram of a shift register of a memory device in accordance with a number of embodiments of the present disclosure.

FIG. 6 is a schematic diagram of a shift register of a memory device in accordance with a number of embodiments of the present disclosure. The shift register 600 is analogous to shift register 500 illustrated in FIG. 5. FIG. 6 shows a sense amplifier 640 coupled to a pair of complementary sense lines 635-1 and 635-2, and a compute component 630-1 coupled to the sense amplifier 640 via pass gates 641-1 and 641-2.

The gates of the pass gates 641-1 and 641-2 can be controlled by a logical operation selection logic signal, "Pass," which can be received from logical operation selection logic 642. For example, an output of the logical operation selection logic 642 can be coupled to the gates of the pass gates 641-1 and 641-2. The logical operation selection logic 642 is coupled to a number of logic selection control input control lines, including "ISO," "TF," "TT," "FT," and "FF." Selection of a logical operation from a plurality of logical operations is determined from the condition of logic selection control signals on the logic selection control input control lines, as well as the data values present on the pair of complementary sense lines 635-1 and 635-2 when isolation transistors are enabled via the "ISO" control signal being asserted.

According to various embodiments, a logical operation selection logic 642 can include four logic selection transistors: a logic selection transistor 643 coupled between the gates of swap transistors 644, which are labeled as "Pass*," and a "TF" signal control line, a logic selection transistor 645 coupled between the gates of the pass gates 641-1 and 641-2 and a "TT" signal control line, a logic selection transistor 646 coupled between the gates of the pass gates 641-1 and 641-2 and a "FT" signal control line, and a logic selection transistor 647 coupled between the gates of the swap transistors 644 and a "FF" signal control line. The gates of the logic selection transistors 643 and 645 are coupled to the true sense line 635-1 through a first isolation transistor 648-1 (having a gate coupled to an "ISO" signal control line). The gates of the logic selection transistors 647 and 646 are coupled to the complementary sense line 635-2 through a second isolation transistor 648-2 (also having a gate coupled to an ISO signal control line).

Data values present on the pair of complementary sense lines 635-1 and 635-2 can be loaded into the compute component 630-0 via pass gates 641-1 and 641-2. When the pass gates 641-1 and 641-2 are enabled, data values on the pair of complementary sense lines 635-1 and 635-2 are passed to the compute component 630-0 and thereby loaded into the shift register 600. The data values on the pair of complementary sense lines 635-1 and 635-2 can be the data value stored in the sense amplifier 640 when the sense amplifier is fired. The logical operation selection logic signal, "Pass," is high to enable the pass gates 641-1 and 641-2.

Data within the compute components 630 can be propagated in accordance with one or more shift clocks (e.g., RIGHT SHIFT and/or LEFT SHIFT). The "ISO," "TF," "TT," "FT," and "FF" control signals can operate to select a logical function to implement based on the data value ("B") in the sense amplifier 640 and the data value ("A") in the corresponding compute component 630. In particular, the "ISO," "TF," "TT," "FT," and "FF" control signals are configured to select the logical function to implement independent from the data value present on the pair of complementary sense lines 635-1 and 635-2 (although the result of the implemented logical operation can be dependent on the data value present on the pair of complementary sense lines 635-1 and 635-2). For example, the "ISO," "TF," "TT," "FT," and "FF" control signals select the logical operation to implement directly since the data value present on the pair of complementary sense lines 635-1 and 635-2 is not passed through logic to operate the gates of the pass gates 641-1 and 641-2.

Additionally, FIG. 6 shows the swap transistors 644 configured to swap the orientation of the pair of complementary sense lines 635-1 and 635-2 between the sense amplifier 640 and the corresponding compute component 630. When the swap transistors 644 are enabled, data values on the pair of complementary sense lines 635-1 and 635-2 on the sense amplifier 640 side of the swap transistors 644 are oppositely-coupled to the pair of complementary sense lines 635-1 and 635-2 on the corresponding compute component 630 side of the swap transistors 644.

The logical operation selection logic signal "Pass" can be activated (e.g., high) to enable (e.g., conducting) the pass gates 641-1 and 641-2 when the "ISO" control signal line is activated and either the "TT" control signal is activated (e.g., high) with data value on the true sense line 635-1 is "1" or the "FT" control signal is activated with the data value on the complementary sense line 635-2 is "1."

The data value on the true sense line 635-1 being a "1" enables the logic selection transistors 643 and 645. The data value on the complementary sense line 635-2 being a "1"

enables the logic selection transistors 646 and 647. If the ISO control signal or either the respective "TT" or "FT" control signal or the data value on the corresponding sense line (e.g., sense line to which the gate of the particular logic selection transistor is coupled) is not high, then the pass gates 641-1 and 641-2 will not be enabled by a particular logic selection transistor.

The logical operation selection logic signal "Pass*" can be activated to enable the swap transistors 644 when the ISO control signal line is activated and either the "TF" control signal is activated with data value on the true sense line 635-1 is "1," or the "FF" control signal is activated with the data value on the complementary sense line 635-2 is "1." If either the respective control signal or the data value on the complementary sense line 635-2 is not high, then the swap transistors 644 will not be enabled by a particular logic selection transistor.

The "Pass*" control signal is not necessarily complementary to the "Pass" control signal. It is possible for the "Pass" and "Pass*" control signals to both be activated or both be deactivated at the same time. However, activation of both the "Pass" and "Pass*" control signals at the same time shorts the pair of complementary sense lines together, which may be a disruptive configuration to be avoided.

The sensing circuitry illustrated in FIG. 6 is configured to select one of a plurality of logical operations to implement directly from the four logic selection control signals (e.g., the logical operation selection is not dependent on the data value present on the pair of complementary sense lines). Some combinations of the logic selection control signals can cause both of the pass gates 641-1 and 641-2 and the swap transistors 644 to be enabled at the same time, which shorts the pair of complementary sense lines 635-1 and 635-2 together.

The shift register 600 can be comprised of a plurality of compute components, such as the compute components 630-0, 630-1, and 630-2. The compute components 630 are analogous to the compute components 530 illustrated in FIG. 5. The pre-charge lines "PRE 1" 604 and "PRE 2" 605 can have the same functionality as described with respect to FIGS. 3A and 3B above. The compute component 630-1 is coupled to a pair of complementary sense lines including a true sense line 635-1 and a complementary sense line 635-2, which may be generally referred to herein as sense lines 635. The sense lines 635 are labeled as "DIGIT(n−1)," "DIGIT (n−1)_," "DIGIT(n)," "DIGIT(n)_," "DIGIT(n+1)," and "DIGIT(n+1)_."

The true sense line "DIGIT(n)" 635-1 is coupled to the node "T1" 651 of the compute component 630-1 and the complementary sense line "DIGIT(n)_" 635-2 is coupled to the note "F2" 653 of the compute component 630-1. A first p-channel transistor 602-1 can include a terminal coupled to a first voltage supply node 601-1, which can be a voltage rail line (e.g., Vdd), a gate coupled to a first pre-charge line "PRE 1" 604, and another terminal coupled to a node "T1" 651. A second p-channel transistor 602-2 can include a terminal coupled to a second voltage supply node 601-2, which can be a voltage rail line (e.g., Vdd), a gate coupled to a second pre-charge line "PRE 2" 605, and another terminal coupled to a node "F2" 653. A first n-channel transistor 606-1 can include a terminal coupled to the node "T1" 651 and a gate coupled to a signal control line "PHASE 1R" 607. A first inverter 608-1 can include an input coupled to the node "T1" 651 and an output coupled to a node "F1" 652. A second n-channel transistor 606-2 can include terminals coupled to the node "F1" 652 and the node "F2" 653, respectively, and a gate coupled to a signal control line "PHASE 2R" 610. A second inverter 608-2 can include an input coupled to the node "F2" 653 and an output coupled to a node "T2" 654. A third n-channel transistor 612-1 can include terminals coupled to the node "T1" 651 and the node "T2" 654, respectively, and a gate coupled to a signal control line "PHASE 2L" 615. A fourth n-channel transistor 612-2 can include a terminal coupled to the node "F2" 653 and a gate coupled to a signal control line "PHASE 1L" 613. The aforementioned components can comprise the compute component 630-1, as denoted by the box.

The shift register 600 can be comprised of a plurality of the compute components 630 such that the compute component 630-0 is a first compute component 630-0, the compute component 630-1 is a second compute component 630-1, and the compute component 630-2 is a third compute component 630-2. The node "T2" 654 of the second compute component 630-1 is coupled to a terminal of the first n-channel transistor 606-1 of the third compute component 630-2 and a terminal of the first n-channel transistor 606-1 of the second compute component 630-1 is coupled to the node "T2" 654 of the first compute component 630-0. The node "F1" 652 of the second compute component 630-1 is coupled to the node "F2" 653 of the first component 630-0 via the fourth n-channel transistor 612-2 of the first compute component 630-0. Similarly, the node "F1" 652 of the third compute component 630-2 is coupled to the node "F2" 653 of the second compute component 630-1 via the fourth n-channel transistor 612-2 of the second compute component 630-1. The signal control lines "PHASE 1R" 607, "PHASE 2R" 610, "PHASE 1L" 613, and "PHASE 2L" 615, and the pre-charge lines "PRE 1" 604 and "PRE 2" 605 can be three non-overlapping two-phase clocks.

Figure 7:
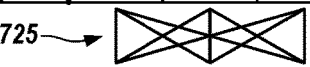
FIG. 7 is a logic table illustrating selectable logic operation results implemented by a sensing circuitry in accordance with a number of embodiments of the present disclosure.

FIG. 7 is a logic table illustrating selectable logic operation results implemented by a sensing circuitry (e.g., sensing circuitry 170 shown in FIG. 1) in accordance with a number of embodiments of the present disclosure. The four logic selection control signals (e.g., TF, TT, FT, and FF), in conjunction with a particular data value present on the complementary sense lines, can be used to select one of a plurality of logical operations to implement involving the starting data values stored in the sense amplifiers 640 and compute components 630 illustrated in FIG. 6. The four control signals (e.g., TF, TT, FT, and FF), in conjunction with a particular data value present on the complementary sense lines, controls the pass gates 641-1 and 641-2 and swap transistors 644, which in turn affects the data value in the compute components 630 and/or sense amplifiers 640 before/after firing. The capability to selectably control the swap transistors 644 facilitates implementing logical operations involving inverse data values (e.g., inverse operands and/or inverse result), among others.

Logic Table 7-1 illustrated in FIG. 7 shows the starting data value stored in the compute components 630 shown in column A at 720, and the starting data value stored in the sense amplifiers 640 shown in column B at 721. The other three column headings in Logic Table 7-1 refer to the state of the pass gates 641-1 and 641-2 and the swap transistors 644, which can respectively be controlled to be OPEN or CLOSED depending on the state of the four logic selection control signals (e.g., TF, TT, FT, and FF), in conjunction with a particular data value present on the pair of complementary sense lines 635-1 and 635-2 when the ISO control signal is asserted. The "NOT OPEN" column 722 corresponds to the pass gates 641-1 and 641-2 and the swap transistors 644 both being in a non-conducting condition, the "OPEN TRUE" column 723 corresponds to the pass gates 641-1 and 641-2 being in a conducting condition, and the "OPEN INVERT" column 724 corresponds to the swap transistors 644 being in a conducting condition. The configuration corresponding to the pass gates 641-1 and 641-2 and the swap transistors 644 both being in a conducting condition is not reflected in Logic Table 7-1 since this results in the sense lines being shorted together.

Via selective control of the pass gates 641-1 and 641-2 and the swap transistors 644, each of the three columns of the upper portion of Logic Table 7-1 can be combined with each of the three columns of the lower portion of Logic Table 7-1 to provide nine (e.g., 3×3) different result combinations, corresponding to nine different logical operations, as indicated by the various connecting paths shown at 725. The nine different selectable logical operations that can be implemented by the sensing circuitry are summarized in Logic Table 7-2.

The columns of Logic Table 7-2 show a heading 726 that includes the states of logic selection control signals (e.g., FF, FT, TF, TT). For example, the state of a first logic selection control signal (e.g., FF) is provided in row 727-1, the state of a second logic selection control signal (e.g., FT) is provided in row 727-2, the state of a third logic selection control signal (e.g., TF) is provided in row 727-3, and the state of a fourth logic selection control signal (e.g., TT) is provided in row 727-4. The particular logical operation corresponding to the results is summarized in row 728.

FIG. 8 shows signaling that can be associated with two right shifts of data in accordance with a number of embodiments of the present disclosure. For example, the signaling can be associated with a first right shift of data from the first compute component 530-0 to the second compute component 530-1 and a second right shift of data from the second compute component 530-1 to the third compute component 530-2 as illustrated in FIG. 5. FIG. 7 includes waveforms corresponding to signals that can be applied to the corresponding signal control lines "PHASE 1R" 507, "PHASE 2R" 510, "PHASE 1L" 513, and "PHASE 2L" 515 shown in FIG. 5. FIG. 8 also includes waveforms corresponding to signals that can be applied to the corresponding pre-charge lines "PRE 1" 504 and "PRE 2" 505 shown in FIG. 5. In another example, the signaling can be associated with a two right shifts of data in the shift register 300 illustrated in FIG. 3A from a first compute component 330-0 to the second compute component 330-1 to the third compute component 330-2.

Referring back to the shift register 500 illustrated in FIG. 5, an example operation of the shift register 500 to perform two right shifts is as follows. At time $T_0$, the signal control lines "PHASE 2R" 510 and "PHASE 2L" 515 are enabled. Enabling the signal control lines "PHASE 2R" 510 and "PHASE 2L" 515 at time $T_0$ enables feedback on the latch of the first compute component 530-0 such that the data value in the first compute component 530-0 (for example, the result of a previous logical operation) is latched therein. As shown at time $T_1$, the signal control lines "PHASE 2R" 510 and "PHASE 2L" 515 are disabled, which disables feedback on the latch of the first compute component 530-0, as described above. To perform a first right shift, the pre-charge line "PRE 1" 504 is enabled at $T_2$ and disabled at $T_3$. Enabling the pre-charge line "PRE 1" 504 causes the first p-channel transistor 502-1 of the second compute component 530-1 to conduct, which passes an operating voltage causing the node "T1" 551 of the second compute component 530-1 to be pre-charged to high. The signal control line "PHASE 1R" 507 is enabled at time $T_4$ and disabled at time $T_5$. Enabling the signal control line "PHASE 1R" 507 causes the first n-channel transistor 506-1 of the second compute component 530-1 to conduct, which causes the data value at node "T2" 554 of the first compute component 530-0 to move right to the node "T1" 551 of the second compute component 530-1. The pre-charge line "PRE 2" 504 is subsequently enabled at $T_6$ and disabled at $T_7$. Enabling the pre-charge line "PRE 2" 505 causes the second p-channel transistor 502-2 of the second compute component 530-1 to conduct, which passes an operating voltage causing the node "F2" 553 of the second compute component 530-1 to be pre-charged to high. The signal control line "PHASE 2R" 510 is then enabled at time $T_8$ and disabled at time $T_9$. Enabling the signal control line "PHASE 2R" 510 causes the second n-channel transistor 506-2 of the second compute component 530-1 to conduct, which causes the data value from the node "F1" 552 of the second compute component 530-1 to move right to the node "F2" 553 of the second compute component 530-1, thereby completing a right shift from the first compute component 530-0 to the second compute component 530-1.

To perform a second right shift, the pre-charge line "PRE 1" 504 is enabled again at $T_{10}$ and disabled at $T_{11}$. Enabling the pre-charge line "PRE 1" 504 causes the first p-channel transistor 502-1 of the third compute component 530-2 to conduct, which passes an operating voltage causing the node "T1" 551 of the third compute component 530-2 to be pre-charged to high. The signal control line "PHASE 1R" 507 is enabled again at time $T_{12}$ and disabled at time $T_{13}$. Enabling the signal control line "PHASE 1R" 507 causes the first n-channel transistor 506-1 of the third compute component 530-2 to conduct, which causes the data value at node "T2" 554 of the second compute component 530-1 to move right to node "T1" 551 of the third compute component 530-2. The pre-charge line "PRE 2" 505 is again subsequently enabled at $T_{14}$ and disabled at $T_{15}$. Enabling the pre-charge line "PRE 2" 505 causes the second p-channel transistor 502-2 of the third compute component 530-2 to conduct, which passes an operating voltage causing the node "F2" 553 of the third compute component 530-2 to be pre-charged to high. The signal control line "PHASE 2R" 510 is enabled at time $T_{16}$. Enabling the signal control line "PHASE 2R" 510 causes the second n-channel transistor 506-2 of the third compute component 530-2 to conduct, which causes the data value from the node "F1" 552 of the third compute component 530-2 to move right to the node "F2" 553 of the third compute component 530-2, thereby completing a second right shift from the second compute component 530-1 to the third compute component 530-2. Subsequent to the second right shift, the signal control line "PHASE 1R" 507 remains disabled, the signal control line "PHASE 2R" 510 remains enabled, and the signal control line "PHASE 2L" 515 is enabled at time $T_{17}$ such that feedback is enabled to latch the data value in the third compute component 530-2 latches.

The above sequence (enabling/disabling the pre-charge line "PRE 1" and the signal control line "PHASE 1R," and subsequently enabling/disabling the pre-charge line "PRE 2" and the signal control line "PHASE 2R") can be repeated to achieve a desired number of right shifts in the example shown in FIG. 5 as well as the examples shown in FIGS. 3, 6, 9, and 10.

Figure 9:
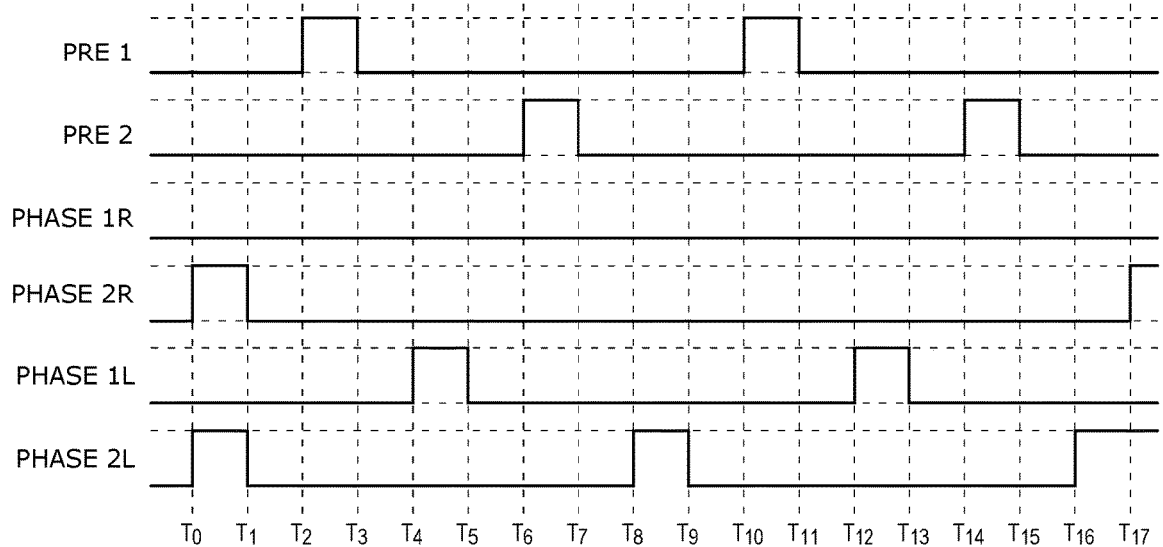
FIG. 9 is a timing diagram associated with two left shifts of data in accordance with a number of embodiments of the present disclosure.

FIG. 9 shows signaling that can be associated with a left shift of data in accordance with a number of embodiments of the present disclosure. For example, the signaling can be associated with a first left shift of data from the third compute component 530-2 illustrated in FIG. 5 to the second compute component 530-1 and a second left shift of data from the second compute component 530-1 to the first compute component 530-0. FIG. 9 includes waveforms corresponding to signals that can be applied to the corresponding signal control lines "PHASE 1R" 507, "PHASE 2R" 510, "PHASE 1L" 513, and "PHASE 2L" 515 shown in FIG. 5. FIG. 8 also includes waveforms corresponding to signals that can be applied to the corresponding pre-charge lines "PRE 1" 504 and "PRE 2" 505 shown in FIG. 5.

Referring back to the shift register 500 illustrated in FIG. 5, an example operation of the shift register 500 to perform two left shifts is as follows. At time $T_0$, the signal control lines "PHASE 2R" 510 and "PHASE 2L" 515 are enabled. Enabling the signal control lines "PHASE 2R" 510 and "PHASE 2L" 515 at time $T_0$ enables feedback on the latch of the third compute component 530-2 such that the data value in the third compute component 530-2 (for example, the result of a previous logical operation) is latched therein. As shown at time $T_1$, the signal control lines "PHASE 2R" 510 and "PHASE 2L" 515 are disabled, which disables feedback on the latch of the third compute component 530-2, as described above. To perform a first left shift, the pre-charge line "PRE 1" 504 is enabled at $T_2$ and disabled at $T_3$. Enabling the pre-charge line "PRE 1" 504 causes the first p-channel transistor 502-1 of the second compute component 530-1 to conduct, which passes an operating voltage causing the node "T1" 551 of the second compute component 530-1 to be pre-charged to high. The signal control line "PHASE 1L" 513 is then enabled at time $T_4$ and disabled at time $T_5$. Enabling the signal control line "PHASE 1L" 513 causes the fourth n-channel transistor 512-2 of the second compute component 530-1 to conduct, which causes the data value from the node "F1" 552 of the third compute component 530-2 to move left to the node "F2" 553 of the second compute component 530-1. The pre-charge line "PRE 2" 505 is subsequently enabled at $T_6$ and disabled at $T_7$. Enabling the pre-charge line "PRE 2" 505 causes the second p-channel transistor 502-2 of the second compute component 530-1 to conduct, which passes an operating voltage causing the node "F2" 553 of the second compute component 530-1 to be pre-charged to high. The signal control line "PHASE 2L" 515 is then enabled at time $T_8$ and disabled at time $T_9$. Enabling the signal control line "PHASE 2L" 515 causes the third n-channel transistor 512-1 of the second compute component 530-1 to conduct, which causes the data value at the node "T2" 554 of the second compute component 530-1 to move left to the node "T1" 551 of the second compute component 530-1, thereby completing a left shift from the third compute component 530-2 to the second compute component 530-1.

To perform a second left shift, the pre-charge line "PRE 1" 504 is enabled again at $T_{10}$ and disabled at $T_{11}$. Enabling the pre-charge line "PRE 1" 504 causes the first p-channel transistor 502-1 of the first compute component 530-0 to conduct, which passes an operating voltage causing the node "T1" 551 of the first compute component 530-0 to be pre-charged to high. The signal control line "PHASE 1L" 513 is enabled again at time $T_{12}$ and disabled at time $T_{13}$. Enabling the signal control line "PHASE 1L" 513 causes the fourth n-channel transistor 512-2 of the first compute component 530-0 to conduct, which causes the data value from the node "F1" 552 of the second compute component 530-1 to move left to the node "F2" 553 of the first compute component 530-0. The pre-charge line "PRE 2" is subsequently enabled at $T_{14}$ and disabled at $T_{15}$. Enabling the pre-charge line "PRE 2" 505 causes the second p-channel transistor 502-2 of the first compute component 530-0 to conduct, which passes an operating voltage causing the node "F2" 553 of the first compute component 530-0 to be pre-charged to high. The signal control line "PHASE 2L" 515 is enabled again at time $T_{16}$. Enabling the signal control line "PHASE 2L" 515 causes the third n-channel transistor 512-1 of the first compute component 530-0 to conduct, which causes the data value at the node "T2" 554 of the first compute component 530-0 to move left to the node "T1" 551 of the first compute component 530-0, thereby completing a second left shift from the second compute component 530-1 to the first compute component 530-0. Subsequent to the second left shift, the signal control line "PHASE 1R" 507 remains disabled, the signal control line "PHASE 2R" 510 remains enabled, and the signal control line "PHASE 2L" 515 is enabled at time $T_{17}$ such that feedback is enabled to latch the data value in the first compute component 530-0 latches.

The above sequence (enabling/disabling the pre-charge line "PRE 1" and the signal control line "PHASE 1L," and subsequently enabling/disabling the pre-charge line "PRE 2" and the signal control line "PHASE 2L") can be repeated to achieve a desired number of left shifts in the example shown in FIG. 5 as well as the examples shown in FIGS. 6, 9, and 10.

Figure 10:
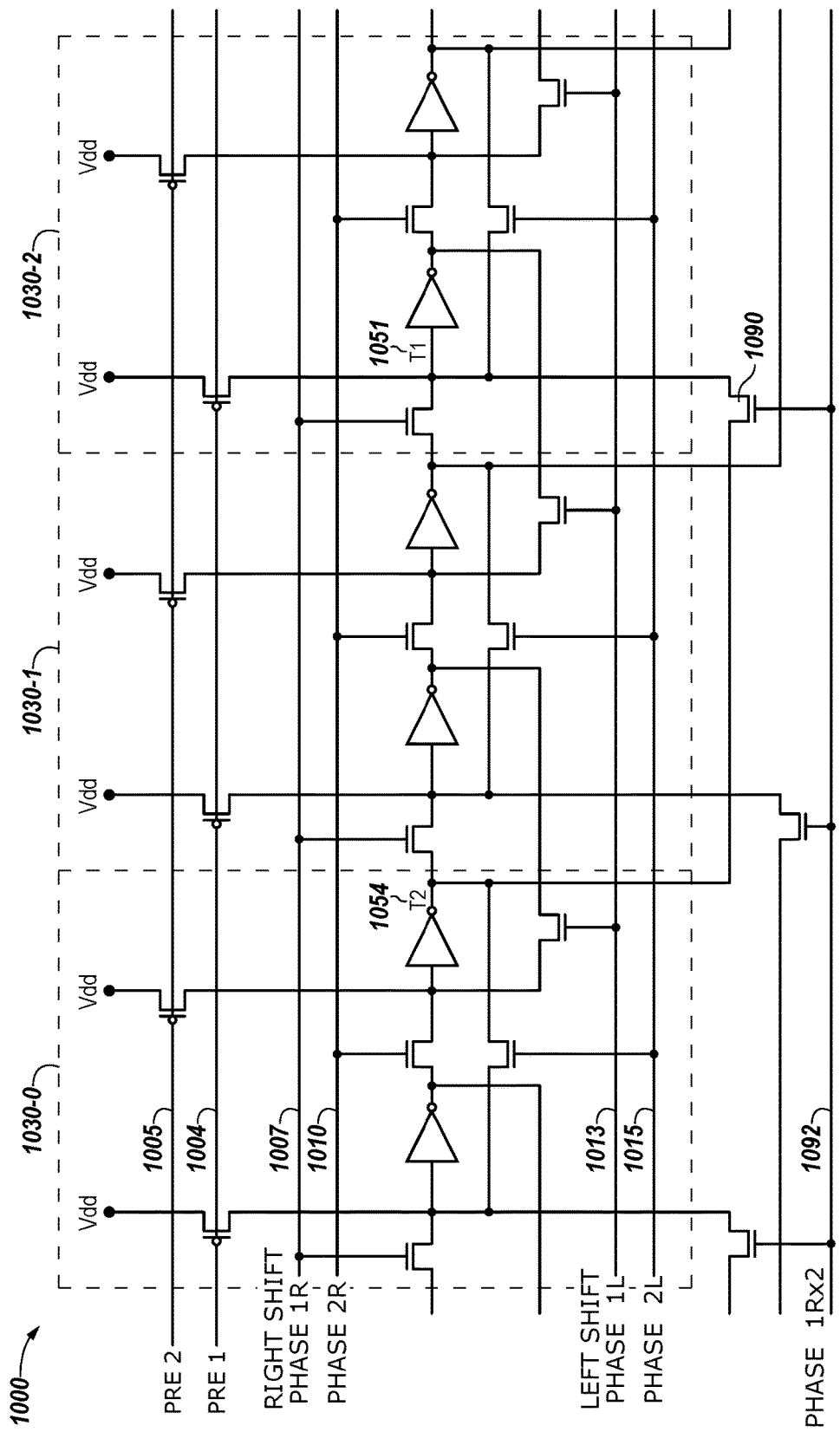
FIG. 10 is a schematic diagram of a shift register configured to perform a right shift, a left shift, and/or a right shift by two in accordance with a number of embodiments of the present disclosure.

FIG. 10 is a schematic diagram of a shift register 1000 configured to perform a right shift, a left shift, and/or a right shift by two in accordance with a number of embodiments of the present disclosure. The shift register 1000 can be comprised of a plurality of compute components 1030, such as the first compute component 1030-0, the second compute component 1030-1, and the third compute component 1030-2. The compute components 1030 are analogous to the compute components 530 illustrated in FIG. 5. The pre-charge lines "PRE 1" 1004 and "PRE 2" 1005 can have the same functionality as described with respect to FIGS. 3A and 3B above. The example illustrated in FIG. 10 differs from the example illustrated in FIG. 5 by the addition of an n-channel transistor 1090. As illustrated in FIG. 10, the additional n-channel transistor 1090 has a gate coupled to a signal control line "PHASE 1R×2" 1092, a first terminal coupled to the node "T2" 1054 of the first compute component 1030-0, and a second terminal coupled to the node "T1" 1051 of the third compute component 1030-2.

An example of the functionality of the embodiment shown in FIG. 10 is as follows. A right shift by two can be performed as described with respect to the shift register 500 illustrated in FIG. 5 and the signaling shown in FIG. 7. However, when the signal control line "PHASE 1R" 507 would have been enabled, the signal control line "PHASE 1R×2" 1092 is enabled. When the signal control line "PHASE 1R×2" 1092 is enabled the additional n-channel transistor 1090 will conduct and the node "T2" 1054 of the first compute component 1030-0 will be coupled to the node "T1" 1051 of the third compute component 1030-2 such that the right shift operation bypasses the second compute component 1030-1 as illustrated in FIG. 10. Thus, data can be shifted from a compute component (e.g., the first compute component 1030-0) to another compute component (e.g., the third compute component 1030-2) where the two compute components are separated by at least one additional compute component (e.g., the second compute component 1030-1).

Although FIG. 10 shows an example where a right shift by two can be performed, embodiments of the present disclosure are not so limited. The shift register 1000 can be configured so that the additional n-channel transistor 1090 is coupled to a compute component more than two compute components over such that a right shift by more than two can be performed. For example, the additional n-channel transistor 1090 can have a first terminal coupled to the node "T2" 1054 of the first compute component 1030-0 and a second terminal coupled to a node "T1" 1051 of a fourth compute component 1030-3 (not shown in FIG. 10). Also, while FIG. 10 shows an example having the components for both a right shift and a left shift, the shift register 1000 can also have only the components of the right shift register 300 illustrated in FIG. 3 or only the components of a left shift register by excluding the first and second n-channel transistors 506-1 and 506-2 and the signal control lines "PHASE 1R" 507 and "PHASE 2R" 510 of the shift register 500 illustrated in FIG. 5.

Figure 11:
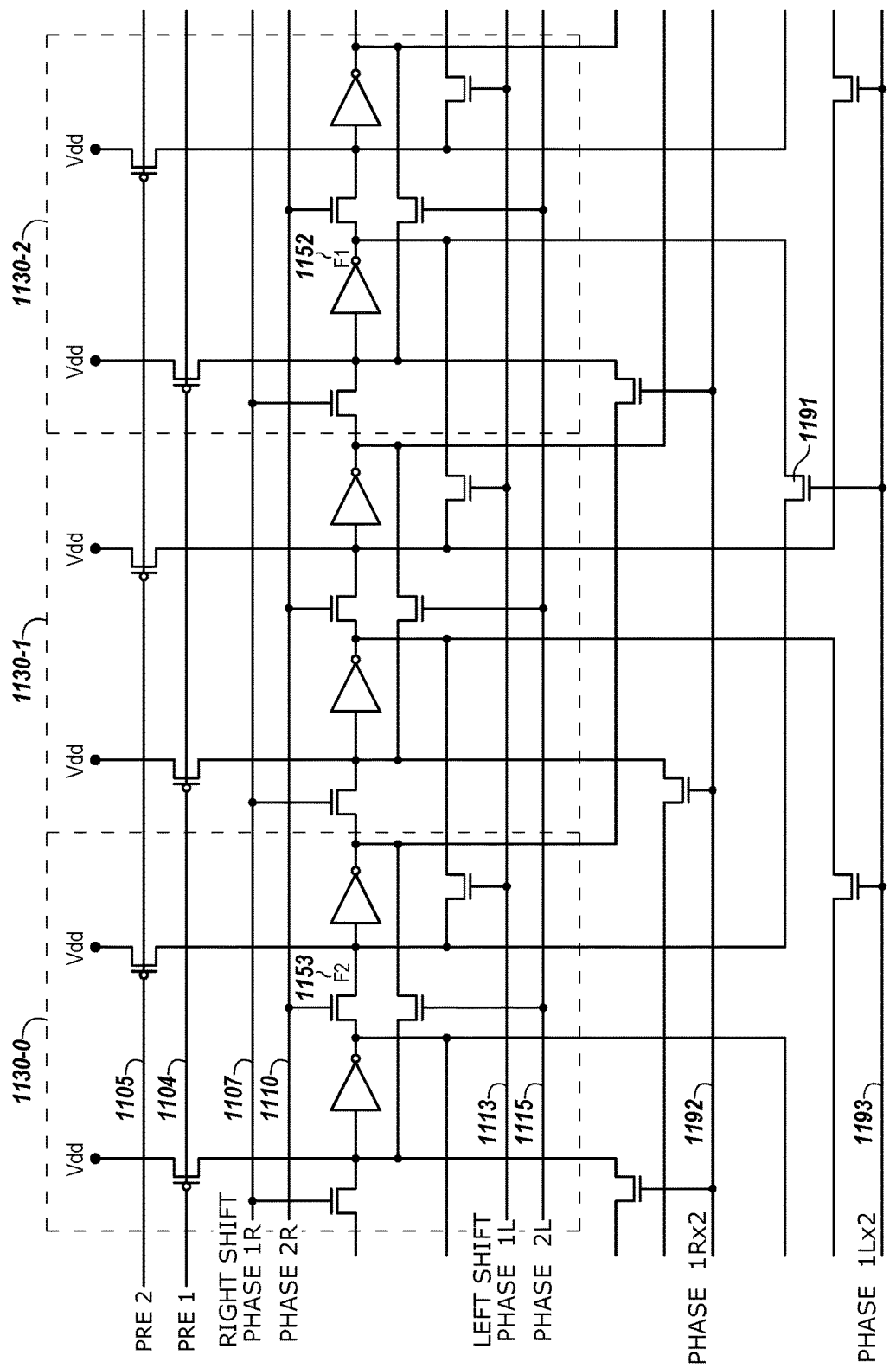
FIG. 11 is a schematic diagram of a shift register configured to perform a right shift, a left shift, a right shift by two, and/or a left shift by two in accordance with a number of embodiments of the present disclosure.

FIG. 11 is a schematic diagram of a shift register 1100 configured to perform a right shift, a left shift, a right shift by two, and/or a left shift by two in accordance with a number of embodiments of the present disclosure. The shift register 1100 can be comprised of a plurality of compute components 1130, such as the first compute component 1130-0, the second compute component 1130-1, and the third compute component 1130-2. The compute components 1130 are analogous to the compute components 530 illustrated in FIG. 5. The pre-charge lines "PRE 1" 1104 and "PRE 2" 1105 can have the same functionality as described with respect to FIGS. 3A and 3B above. The example illustrated in FIG. 11 differs from the example illustrated in FIG. 9 by the addition of another n-channel transistor 1191. The additional n-channel transistor 1191 has a gate coupled to a signal control line "PHASE 1L×2" 1193, a first terminal coupled to the node "F1" 1152 of the third compute component 1130-2, and a second terminal coupled to the node "F2" 1153 of the first compute component 1130-0.

An example of the functionality of the embodiment shown in FIG. 11 is as follows. A left shift by two can be performed as described with respect to the shift register 500 illustrated in FIG. 5 and the signaling shown in FIG. 8. However, when the signal control line "PHASE 1L" 513 would have been enabled, the signal control line "PHASE 1L×2" 1193 is enabled. When the signal control line "PHASE 1L×2" 1193 is enabled the additional n-channel transistor 1191 will conduct and the node "F1" 1152 of the third compute component 1130-2 will be coupled to the node "F2" 1153 of the first compute component 1130-0 such that the left shift operation bypasses the second compute component 1130-1 as illustrated in FIG. 11. Thus, data can be shifted from a compute component (e.g., the third compute component 1130-2) to another compute component (e.g., the first compute component 1130-0) where the two compute components are separated by at least one additional compute component (e.g., the second compute component 1130-1).

Although FIG. 11 shows an example where a left shift by two can be performed, embodiments of the present disclosure are not so limited. The shift register 1100 can be configured so that the additional n-channel transistors 1191 is coupled to a compute component more than two compute components over such that a left shift by more than two can be performed. For example, the additional n-channel transistor 1191 can have a first terminal coupled to the node "F1" 1152 of the fourth compute component 1130-3 (not shown in FIG. 11), and a second terminal coupled to the node "F2" 1153 of the first compute component 1130-0 as illustrated in FIG. 11. Also, while FIG. 11 shows an example having the components for a right shift, a left shift, and a right shift by two, the shift register 1100 can be configured to perform any combination of a left shift, a right shift, a right shift by two, or a left shift by two as previously described above.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
    a first pre-charge line;
    a second pre-charge line;
    a first transistor including a gate coupled to the first pre-charge line, and a first terminal coupled to a first sense line and a second terminal coupled to a first voltage supply node;
    a second transistor including a gate coupled to a first control line and a terminal coupled to the first sense line;
    a first inverter including an input coupled to the first sense line;
    a third transistor including a gate coupled to the second pre-charge line, and a first terminal coupled to a second sense line and a second terminal coupled to a second voltage supply node;
    a fourth transistor including a gate coupled to a second control line, a first terminal coupled to an output of the first inverter, and a second terminal coupled to the second sense line; and
    a second inverter including an input coupled to the second sense line.

2. The apparatus of claim 1, wherein the apparatus is a shift register.

3. The apparatus of claim 1, wherein the first sense line is coupled to a first memory cell and is on pitch therewith, and wherein the second sense line is coupled to a second memory cell and is on pitch therewith.

4. The apparatus of claim 1, wherein the first transistor, the second transistor, the first inverter, the third transistor, the fourth transistor, and the second inverter collectively comprise a compute component,
    wherein the compute component is on pitch with the first sense line and the second sense line, and
    wherein the apparatus includes a plurality of compute components.

5. The apparatus of claim 1, further comprising:
    a fifth transistor including a gate coupled to a third control line, a first terminal coupled to the first sense line, and a second terminal coupled to an output of the second inverter; and a sixth transistor including a gate coupled to a fourth control line and a terminal coupled to the second sense line.

6. The apparatus of claim 5, wherein the first transistor, the second transistor, the first inverter, the third transistor, the fourth transistor, the second inverter, the fifth transistor, and the sixth transistor collectively comprise a compute component,
wherein the compute component is on pitch with the first sense line and the second sense line; and
wherein the apparatus includes a plurality of compute components.

7. An apparatus, comprising:
an array comprising a plurality of columns of memory cells; and
a controller coupled to the array and configured to shift data, wherein, in order to shift the data, the controller is configured to cause:
pre-charging of a first node of a compute component coupled to a column of memory cells with an operating voltage; and
pre-charging of a second node of the compute component with the operating voltage.

8. The apparatus of claim 7, wherein the apparatus further comprises:
a first pre-charge line; and
a second pre-charge line,
wherein the compute component comprises:
a first transistor coupled to the first pre-charge line and the first node; and
a second transistor coupled to the second pre-charge line and the second node, and wherein, in order to shift the data, the controller is further configured to:
enable the first pre-charge line to pass the operating voltage to the first node; and
enable the second pre-charge line to pass the operating voltage to the second node.

9. The apparatus of claim 8, wherein, in order to shift the data, the controller is further configured to cause:
pre-charging of the first node prior to enabling a first signal control line; and
pre-charging of the second node prior to enabling a second signal control line.

10. The apparatus of claim 8, wherein the compute component is a first compute component coupled to a first column of memory cells,
wherein the apparatus further comprises a third transistor coupled to the first node of the first compute component, a node of a second compute component coupled to a second column of memory cells, and a third signal control line;
wherein the first compute component and the second compute component are separated by at least one additional compute component; and
wherein the controller is further configured to cause pre-charging of the first node of the first compute component prior to enabling the third signal control line.

11. The apparatus of claim 8, wherein the compute component is a first compute component coupled to a first column of memory cells,
wherein the apparatus further comprises a third transistor coupled to the second node of the compute component, a node of a second compute component coupled to a second column of memory cells, and a third signal control line;
wherein the first compute component and the second compute component are separated by at least one additional compute component; and
wherein the controller is further configured to cause pre-charging of the first node of the first compute component prior to enabling the third signal control line.

12. The apparatus of claim 8, wherein the compute component further comprises:
a third transistor coupled to the first node; and
a fourth transistor coupled to the second node,
wherein the third transistor and the fourth transistor are configured to pass a low voltage relative to the operating voltage.

13. The apparatus of claim 7, wherein the apparatus further comprises:
a sense amplifier coupled to the compute component and the column of memory cells; and
a logical operation selection logic coupled to the sense amplifier.

14. The apparatus of claim 13, wherein the controller is further configured to cause logical operations to be performed, in parallel, using data values stored in the plurality of columns of memory cells.

15. The apparatus of claim 14, wherein the controller is further configured to cause logical operations to be performed without transferring data via a bus.

16. A method for shifting data, comprising:
applying a first signal to a first pre-charge line that is coupled to a gate of a first transistor;
applying a second signal to a first control line that is coupled to a gate of a second transistor;
applying a third signal to a second pre-charge line that is coupled to a gate of a fourth transistor; and
applying a fourth signal to a second control line that is coupled to a gate of a fifth transistor.

17. The method of claim 16, wherein the method includes applying a fifth signal to a third control line that is coupled to a gate of a sixth transistor.

18. The method of claim 16, wherein the method includes:
applying a fifth signal to a third control line that is coupled to a gate of a sixth transistor; and
applying a sixth signal to a fourth control line that is coupled to a gate of a seventh transistor.

19. The method of claim 18, wherein the method includes applying a seventh signal to a fifth control line that is coupled to a gate of an eighth transistor.

20. The method of claim 16, wherein the method includes shifting a data value resulting from a logical operation.

* * * * *